US 6,681,499 B2

(12) United States Patent
Scranton et al.

(10) Patent No.: US 6,681,499 B2
(45) Date of Patent: Jan. 27, 2004

(54) SUBSTRATE DRYING METHOD FOR USE WITH A SURFACE TENSION EFFECT DRYER WITH POROUS VESSEL WALLS

(75) Inventors: Dana Scranton, Kalispell, MT (US); Ian Sharp, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 10/336,193

(22) Filed: Jan. 3, 2003

(65) Prior Publication Data

US 2003/0101616 A1 Jun. 5, 2003

Related U.S. Application Data

(62) Division of application No. 09/590,724, filed on Jun. 8, 2000, now Pat. No. 6,502,591.

(51) Int. Cl.[7] .................................................. B08B 3/10
(52) U.S. Cl. ............................ 34/467; 34/418; 134/95.2
(58) Field of Search ........................... 34/406–410, 423, 34/424, 448, 449, 467–470, 77, 78; 134/1.2, 1.3, 26, 30, 31, 34, 36, 37

(56) References Cited

U.S. PATENT DOCUMENTS

| | | | | |
|---|---|---|---|---|
| 3,543,776 A | * | 12/1970 | Layton | 134/110 |
| 4,361,163 A | * | 11/1982 | Aigo | 134/199 |
| 5,069,235 A | * | 12/1991 | Vetter et al. | 134/113 |
| 5,656,097 A | * | 8/1997 | Olesen et al. | 134/1 |
| 5,743,280 A | * | 4/1998 | Han | 134/56 R |
| 5,820,688 A | * | 10/1998 | Köppl et al. | 134/2 |
| 5,849,091 A | * | 12/1998 | Skrovan et al. | 134/1 |
| 6,119,367 A | * | 9/2000 | Kamikawa et al. | 34/401 |
| 6,132,523 A | * | 10/2000 | Okuda et al. | 134/36 |
| 6,134,807 A | * | 10/2000 | Komino et al. | 34/418 |
| 6,161,300 A | * | 12/2000 | Kim | 34/73 |
| 6,164,297 A | * | 12/2000 | Kamikawa | 134/61 |
| 6,273,107 B1 | * | 8/2001 | Adams et al. | 134/102.1 |
| 6,412,501 B1 | * | 7/2002 | Onoda et al. | 134/95.2 |
| 6,497,055 B2 | * | 12/2002 | Murphy et al. | 34/471 |
| 6,519,869 B2 | * | 2/2003 | Peng | 34/487 |

\* cited by examiner

Primary Examiner—Henry Bennett
Assistant Examiner—C Nguyen
(74) Attorney, Agent, or Firm—Perkins Coie LLP

(57) ABSTRACT

A processor and method for rinsing and drying of semiconductor substrates includes a process vessel contained within an outer containment vessel. A diluted organic vapor creates a Marangoni effect flow along the surface of processing liquid contained within the process vessel. The process vessel includes porous walls that allow residual chemicals, organic species, and other unwanted materials to flow from the process vessel to the outer containment vessel. The porous walls allow for the maintenance of a stable surface tension gradient to sustain a consistent Marangoni force for even drying. Replacement processing fluid is preferably introduced to the process vessel to prevent the build up of organic species in the surface layer of the processing fluid.

19 Claims, 3 Drawing Sheets

SUBSTRATE DRYING METHOD FOR USE WITH A SURFACE TENSION EFFECT DRYER WITH POROUS VESSEL WALLS

This Application is a Division of U.S. patent application Ser. No. 09/590,724, filed on Jun. 8, 2000, now U.S. Pat. No. 6,502,591, and incorporated herein by reference.

FIELD OF THE INVENTION

The field of the invention is rinsing and drying of semiconductor substrates. More specifically, the invention relates to methods and devices for drying semiconductor substrates using a surface tension effects.

BACKGROUND OF THE INVENTION

During the processing of semiconductor substrates into electronic devices, such as integrated circuits, it is necessary to rinse and dry the semiconductor substrates. The rinsing process removes residual chemicals, particulate matter, and contaminants from the semiconductor substrates. Chemical residues and contaminants that are not removed during the rinsing and drying steps reduce the overall yield of the manufacturing process. This reduces the number of usable electronic components, such as integrated circuits, microprocessors, memory devices, etc., that can be obtained from a semiconductor substrate. Contamination problems are particularly troublesome in current semiconductor processes where an increasing number of ever smaller electronic devices are formed on a semiconductor substrate. As semiconductor manufacturing technology advances, the electronic devices formed on the substrates have become progressively smaller, so that more devices are fit onto the substrate, to provide more ever more sophisticated, versatile, and economic electronic end products. However, as a result, contamination becomes even more difficult to control, as even smaller particles can act as contaminants. Consequently, ever smaller particles must be removed or excluded. As avoiding contamination caused by smaller particles is more difficult than avoiding contamination by larger particles, rinsing and drying semiconductor substrates now presents additional design challenges.

To reduce contamination, various surface tension effect techniques have been used. Two of the most widely used are thermocapillary and solutocapillary techniques. U.S. Pat. No. 4,722,752 (Steck) teaches that the use of warm or hot water, with the subsequent reduction in surface tension, can aid in the drying of a semiconductor wafer through a combination of evaporation and low surface tension.

U.S. Pat. No. 4,911,761 (McConnell et al.), U.S. Pat. No. 5,271,774 (Leenaars et al.), U.S. Pat. No. 5,807,439 (Akatsu et al.), and U.S. Pat. No. 5,571,337 (Mohindra et al.), and European Patent Specification No. 0 385 536 B1. (Lenaars et al.). describe solutocapillary techniques McConnell et al. uses a relatively thick layer of an organic solvent such as isopropyl alcohol (IPA) on the surface of a liquid such as water, within a closed and preferably heated process vessel. The layer of solvent is then allowed to recede over the semiconductor wafers. The organic solvent creates a displacement of the water on the liquid surface, effectively diluting the water near the surface. This reduces the surface tension of the surface region, causing displacement of water on the wafer surface by the organic solvent.

Mohindra et al. teaches that draining water slowly over the surface of a semiconductor wafer while simultaneously introducing IPA in dilute form causes a lowering of the surface tension of the surface region of the water. The reduced surface tension located adjacent to the face of the semiconductor wafer promotes the removal of water from the work piece. The Mohindra et al. apparatus dries the wafers without substantial movement of the wafers. However, non-uniform drying (from the top of the wafer to the bottom) may result due to an accumulation of contaminants at the surface layer of the water. Since the liquid at the surface is unable to cascade once the water first starts to recede, an increasing concentration of contaminants builds near the surface layer as the water level decreases. The accumulation of contaminants, and particularly organic contaminants, alters the surface tension gradient as a function of time and position along the face of the semiconductor wafer.

Lenaars et al. describes the introduction of an organic solvent, such as IPA, in the presence of a continuously refreshed surface layer of water while simultaneously moving the wafers through the liquid-gas interface. A Marangoni effect flow is produced, creating a region of low surface tension directly adjacent to the semiconductor wafer surface. As is well known in the field, the Marangoni effect produces a flow of liquid from the region of low surface tension to a region of high surface tension.

In McConnell et al. and Mohindra et al., the semiconductor wafers are held in a stationary position during the rinsing and drying steps. In Mohindra et al., the water in the process vessel is drained over the wafers, which produces an inconsistent and constantly changing surface tension from the top of the work piece to the bottom. In McConnell, there is less inconsistency. However, there is still non-uniform surface tension, because the layer of IPA on the surface of the water changes from the top of the vessel to the bottom of the vessel.

In Lenaars et al., this phenomena is reduced by maintaining an overflow of the water at the surface, while introducing an organic vapor continuously during the drying phase. However, movement of the semiconductor wafers during processing is required. Having to move the wafers is disadvantageous because additional components are required, adding to the mechanical complexity, and reducing the reliability of the apparatus. In addition, the movement increases the risk of damage to the wafers during transfer into and out of the liquid.

Accordingly, there is a need for a apparatus and method for rinsing and drying semiconductor substrates that: (1) efficiently removes residual chemicals, particulate matter, organic species, and contaminants from semiconductor substrates; (2) does not produce a gradient of trapped organic species as measured from the top to the bottom of the semiconductor substrate; (3) removes water and contaminants from the surface of the semiconductor substrates; and (4) does not move the semiconductor substrates during rinsing/drying operations.

SUMMARY OF THE INVENTION

In a first aspect of the invention, a processor for rinsing and drying semiconductor substrates is disclosed. The processor includes an outer containment vessel that holds an inner process vessel. One or more semiconductor substrates are loaded within the process vessel. The semiconductor substrates are held stationary within the process vessel. The process vessel includes porous walls which permit the transfer of fluid from the process vessel to the outer containment vessel.

In a second separate aspect of the invention, in a method for rinsing and drying a semiconductor substrate, a processing fluid is introduced into a process vessel. The processing fluid bathes a stationary semiconductor substrate in the process vessel. A dilute organic vapor is introduced above the processing fluid in the process vessel. The processing fluid is evacuated from the process vessel to expose the semiconductor substrate. A lateral Marangoni effect flow is produced on the surface region of the processing fluid contained within the process vessel. The flow originates from the semiconductor substrate and travels across the processing fluid surface region and through a porous wall of the process vessel, into an outer containment vessel. The invention resides in subcombinations of the foregoing features as well.

These aspects provide for a constant uniform concentration gradient of organic liquid on the surface of a processing fluid where a meniscus comes into contact with a semiconductor substrate, while keeping the semiconductor substrate stationary during processing.

It is an object of the invention to provide an improved method and apparatus for rinsing and drying a workpiece.

DETAILED DESCRIPTION OF THE PREFERRED EMBODIMENTS

Figure 1:
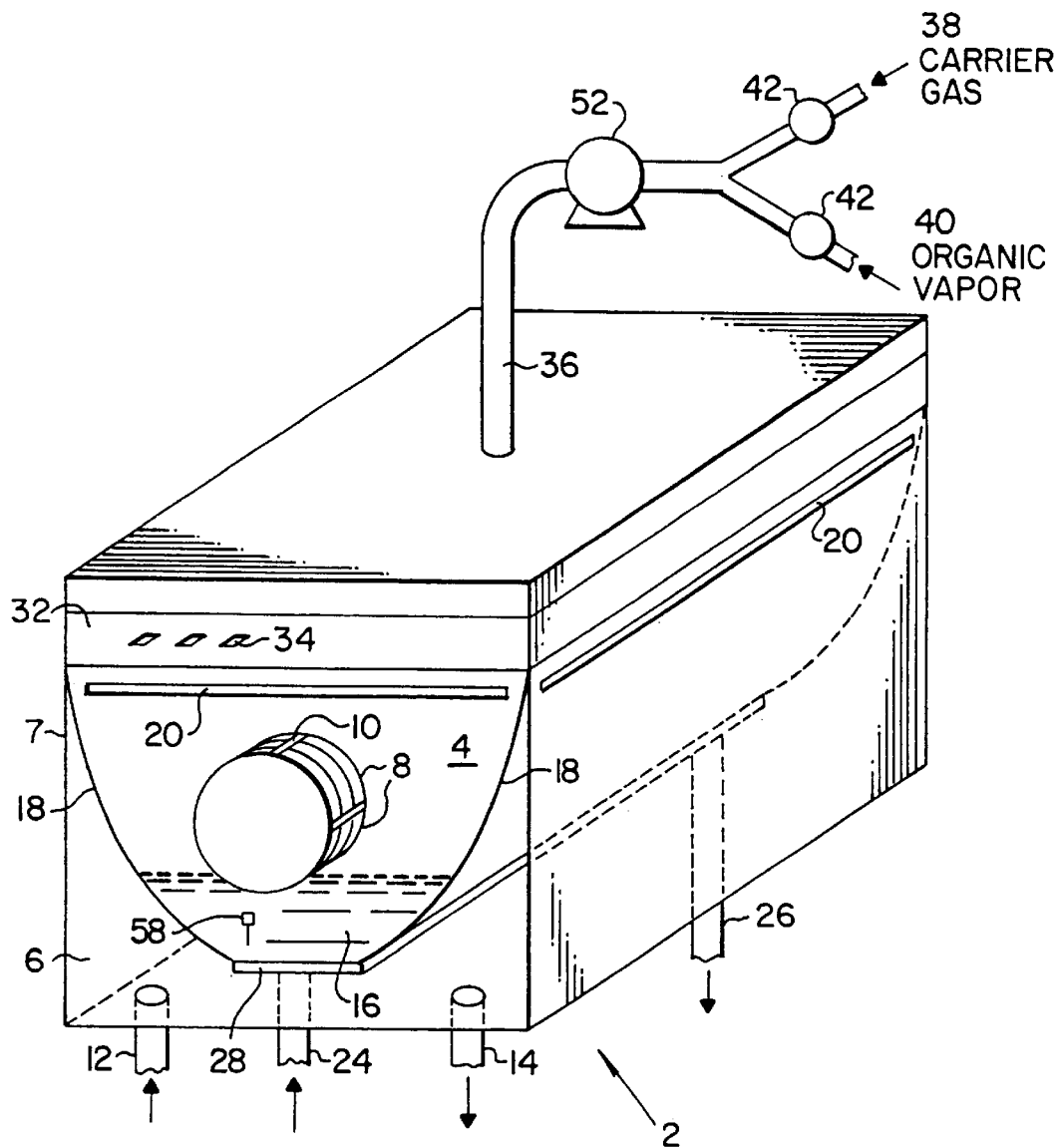
FIG. 1 is a perspective view of the rinser/dryer processor.

Referring now to the drawings, and particularly to FIG. 1, a processor 2 includes a process vessel 4 and an outer containment vessel 6. The processor 2 is used as a rinser/dryer for the processing of semiconductor substrates 8. The term semiconductor substrate or wafer 8 herein includes such work pieces as flat panel displays, semiconductor wafers, photomasks, optical and memory disks, and similar flat media. The processor 2 is adapted to rinse/dry one or more semiconductor substrates 8. Preferably, the semiconductor substrates 8 are held within a cassette or holder 10 positioned within the process vessel 4. The cassette 10 preferably contacts each semiconductor substrate 8 in a minimum number of locations to minimize potential contamination. The cassette 10 and one or more semiconductor substrates 8 are held stationary during the rinsing/drying process. Therefore, no complex mechanical lifting device is needed.

The outer containment vessel 6 has an inlet 12 and outlet 14. The inlet 12 and outlet 14 permit processing fluid 16 such as deionized (DI) water to enter and exit the outer containment vessel 6. With the exception of the inlet 12 and outlet 14, the outer containment vessel 6 is fluid-tight.

Figure 2:
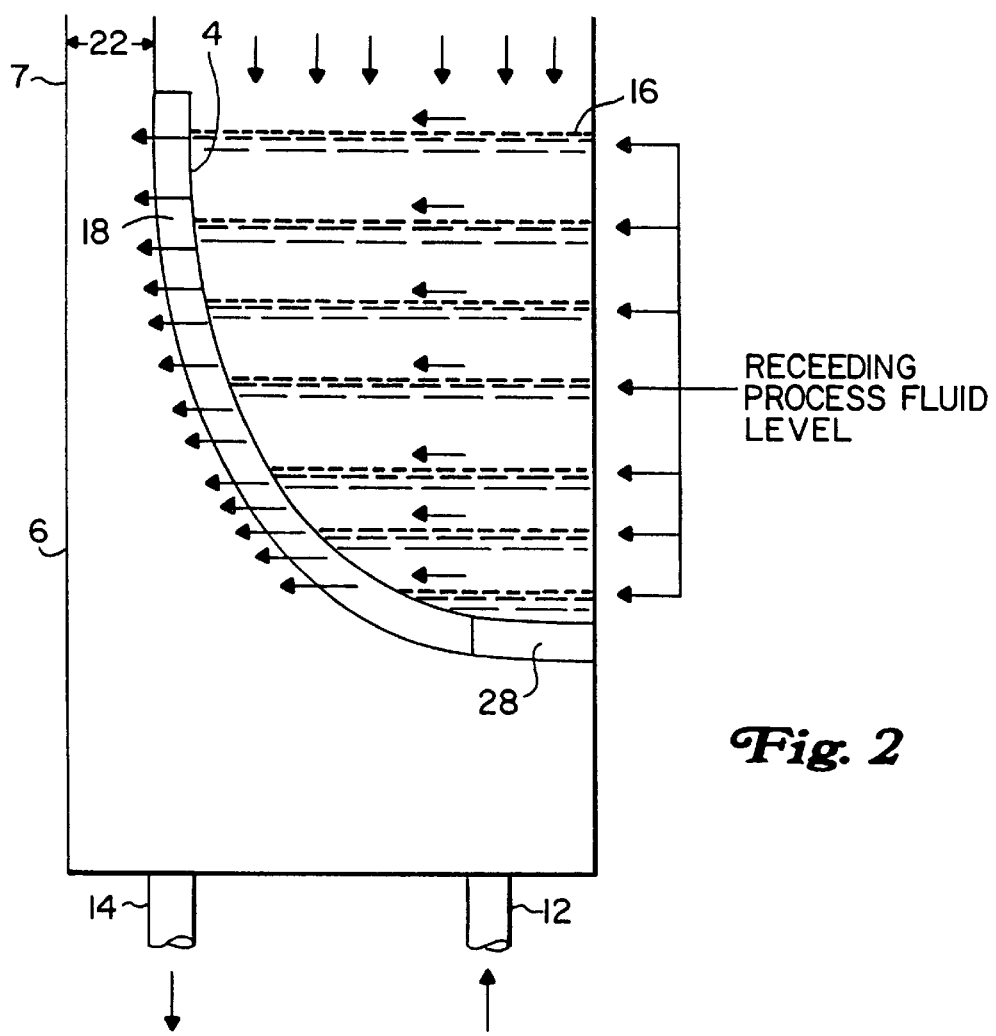
FIG. 2 is a section view of an alternative embodiment.

The process vessel 4, located inside the outer containment vessel 6, is preferably parabolic in shape, as shown in FIGS. 1 and 2. Other shapes, however, may be used. In the embodiment shown in FIG. 1, the walls 18 of the process vessel 4 join the upper sidewall of the outer containment vessel 6. Slot drains 20 are provided at the upper side walls 7, so that processing fluid 16 may cascade out of the process vessel 4 and into the containment vessel 6.

In another embodiment, as shown in FIG. 2, a gap 22 is provided between the outer containment vessel 6 and the upper sidewalls 7 of the process vessel 4. In this embodiment, there are no slot drains.

The process vessel 4 preferably includes an inlet 24 and outlet 26. The level of processing fluid 16 within the process vessel 4 can be controlled by varying the flow rates through the inlet 24 and outlet 26. Preferably, a diffuser 28 is located at the bottom of the process vessel 4. The diffuser 28 aids in producing laminar flow of the processing fluid 16 upwardly within the process vessel 4.

The process vessel 4 advantageously has walls 18 made of porous material. Preferably, the porous walls 18 have a substantially uniform thickness. The porous walls 18 assist in removing residual chemicals, particulate matter, contaminants, organic species, and water from the semiconductor substrates 8. The porous walls 18 are preferably formed of a fluoropolymer having a pre-determined porosity.

Capillary forces across the walls 18, resulting from the porosity, creates a surface tension induced flow from one side of the wall 18 to the other side. The porous walls 18 allow the maintenance of a stable surface tension gradient, thereby producing a consistent Marangoni force during drying.

A gas diffuser 32 is located above the process vessel 4. The gas diffuser 32 advantageously includes a plurality of orifices 34 to permit gas to flow from above and into the processor 2. While the orifices 34 can be of any shape, rectangular-shaped orifices 34 are preferred.

One or more gas delivery pipes 36 are connected to the gas diffuser 32 to supply a carrier gas 38 and an organic vapor 40. The carrier gas 38 and organic vapor 40 are preferably pre-mixed prior to entry into the diffuser 32. The gas delivery pipe 36 is connected to separate sources for the carrier gas 38 and the organic vapor 40. The carrier gas 38 is preferably $N_2$, but other inert gases can also be used. The organic vapor 40 is preferably isopropyl alcohol (IPA). Of course, other materials may be used to produce Marangoni effects. The dilution of the combined carrier gas 38 and organic vapor 40 is preferably controlled with pressure regulators 42.

In a preferred method, a cassette 10 containing a plurality of semiconductor substrates or articles 8 is loaded into the processor 2. To rinse the articles, a processing fluid 16 such as DI water is introduced into the process vessel 4, and the outer containment vessel 6 via inlets 12, 24. The DI water level rises up from bottom along the walls 18. Preferably, the vessel is level so that the DI water level on each side of the walls 18 is the same. In this way, the transport of DI water or other materials across the walls 18 is initially inhibited, during the rinse.

After the semiconductor substrates 8 have been rinsed adequately with DI water, the carrier gas 38 and organic vapor gas 40 are introduced to the process vessel 4 via the gas diffuser 32. A diluted organic vapor is thus created over the surface of the DI water 16 within the process vessel 4. Molecules of the organic vapor are absorbed into the surface layer of the DI water 16. Preferably, the carrier gas 38 and organic vapor gas 40 are continuously delivered to the process vessel 4 during the rinsing process, to replenish the absorbed organic vapor molecules on the surface of the water 16.

Next, the DI water 16 within the process vessel 4 and outer containment vessel 6 is evacuated from the two chambers via outlets 14, 26. The DI water 16 level on both sides of walls 18 thus begins to recede.

Figure 3:
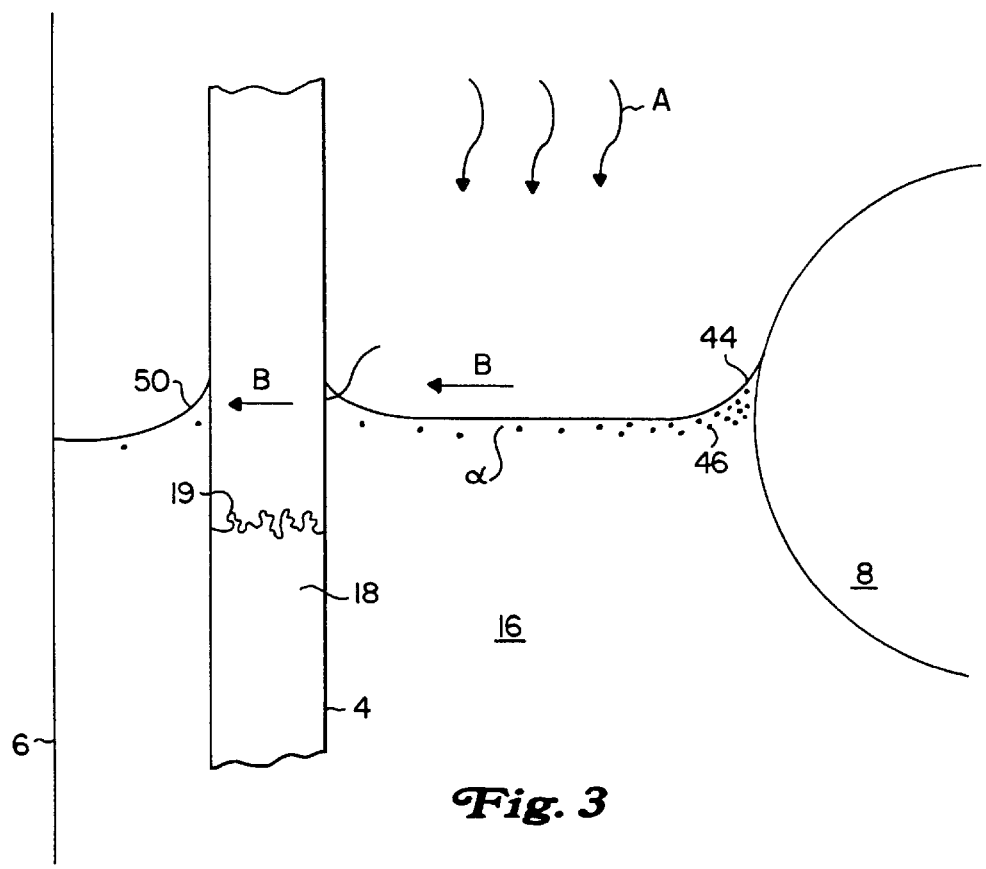
FIG. 3 illustrates schematically the Marangoni effect flow produced according to the invention.

As shown in FIG. 3, menisci 48, 50 form on either side of the wall 18. Preferably, DI water 16 is released from the process vessel 4 and outer containment vessel 6 at a rate such that the two falling menisci 48, 50 of liquid on either side of the wall 18 are at substantially the same level or height during release of the water 16. This further aids in creating spontaneous flow of liquid from low surface tension side located in the process vessel 4 (induced by the organic vapor) to the higher surface tension side located in the outer containment vessel 6.

FIG. 3 illustrates the enhanced Marangoni effect of the processor 2. A semiconductor substrate 8 is illustrated partially submerged in a processing fluid 16 such as DI water. The delivered dilute organic vapor 40 is schematically illustrated by arrows A. A portion of the organic vapor 40 forms a liquid layer on the surface of the processing fluid 16. Individual molecules of the organic vapor 40 are illustrated schematically by dots 46. As shown in FIG. 3, a higher concentration of liquid organic molecules 46 is found nearest the meniscus 44 on the semiconductor substrate 8. A lower concentration of organic molecules 46 is found in the surface region α of the process vessel 4. An even lower concentration of molecules 46 is found in the meniscus 48 adjacent to the wall 18. A still lower concentration of molecules 46 is found in the meniscus 50 formed on the outer contain vessel 6 side of the processor 2.

As a general matter, the surface tension of the organic liquid layer is lower than the surface tension of DI water. Given the gradient formed along the surface of the DI water 16, a spontaneous flow of fluid in direction of arrow B results consistent with the Marangoni effect. The flow in the direction of arrow B pulls remaining chemicals, particulate matter, organic species, contaminants, and water away from the surface of the semiconductor substrate 8.

Since the wall 18 is porous, remnant chemicals, particulate matter, organic species, and other contaminants are able to flow freely from the surface region of the processing fluid 16 within the process vessel 4, to the fluid located in the outer containment vessel 6. In this regard, chemicals and contaminants do not build-up in the surface region α, in contrast to other rinsing/drying techniques.

While it is preferred that the meniscus 48 on the inside portion of the wall 18, within the process vessel 4, fall at the same rate as the meniscus 50 on the outside portion of wall 18, alternative receding rates can be employed. For example, DI water 16 can be admitted to the process vessel 4 through the diffuser 28 at a rate lower than the extraction rate of DI water from the outer containment vessel 6, thus providing for a net flow out of the process vessel 4 via porous walls 18.

During the drying process, i.e., when the DI water 16 or process fluid is removed from the process vessel 4, the surface layer of the DI water 16 is removed from the process vessel 4 via porous walls 18. The DI water 16, which contains organic species, remnant chemicals and the like travels outwardly through pores 19 in the wall 18. Preferably, DI water 16 may be added to the process vessel 4 via the diffuser 28. This maintains an influx of DI water 16 to replenish and replace the surface layer in the process vessel 4 that is extracted via walls 18. This further assists in preventing the accumulation of organic species in the surface layer α of the DI water.

In one preferred embodiment, a pressure differential is established between the process vessel 4 and the outer containment vessel 6. In this regard, walls 18 act as a partition separating two different pressure regions. Typically, the pressure is higher in the pressure vessel 4 than in the outer containment vessel 6. In this manner, flow is induced from the process vessel 4 to the outer containment vessel 6. The pressure differential can be created by pressurizing a region or area of the processor 2 using a compressor or the like. Alternatively, a source of vacuum (not shown) can be used to establish the pressure differential.

At the end of the rinsing/drying process, when both the outer containment vessel 6 and the process vessel 4 have been evacuated of DI water 16, the semiconductor substrates 8 are removed from the processor 2. After removal of the semiconductor substrates 8, the outer containment region 6 can be filled with DI water or other processing fluid 16 to remove any accumulated organic species and other contaminants which have a tendency to clog the pores 19. Fluid flow can be induced in the reverse direction (from the outer containment vessel 6 to the process vessel 4) to clean the pores 19 of the walls 18. This can be done, for example, by establishing a pressure gradient between the process vessel 4 and the outer containment vessel 6.

While DI water 16 has been described as the preferred processing fluid, other processing fluids 16 can be used. In addition, multiple processing fluids 16 can be introduced to the process vessel 4 through the diffuser 28 in a continuous or near continuous manner. This allows different processing fluids to replace each other. The processing fluid 16 inside the process vessel 4 is removed from the process vessel 4 either by slot drains 20 or through the porous walls 18.

To facilitate the processing of semiconductor substrates 8 with multiple processing fluids 16, the processing fluids 16 can advantageously be introduced through the diffuser 28, causing laminar flow of the processing fluids 16 upward and over the semiconductor substrates 8. The expelled processing fluid 16 can then be returned to a process tank for recovery and reuse. Alternatively, the processing fluid 16 can be directed to a waste drain.

Generally, a processing fluid 16 currently in the process vessel 4 is displaced or removed by another processing fluid 16 or with a rinsing fluid that is introduced through the diffuser 28. This causes the previous processing fluid 16 to move upward and out of the process vessel 4 via slot drains 20 or porous walls 18.

In another separate aspect of the invention, a source of sonic energy 58 is disposed in the process vessel 4. The sonic energy source 58 can emit high frequency sound waves to aid in the cleaning ability of the processor 2. The source of sonic energy 58 can include any number of devices commonly known in the art for emitting high frequency sound waves.

While embodiments of the present invention have been shown and described, various modifications may be made without departing from the scope of the invention. The invention, therefore, should not be limited, except to the following claims, and their equivalents.

What is claimed:

1. A method for rinsing and drying a workpiece comprising the steps of:
   introducing a fluid into a process vessel having a porous sidewall;
   immersing a workpiece at least partially into the fluid;
   introducing an organic vapor above the fluid in the process vessel;
   removing the fluid from the process vessel via flow through the porous sidewall of the process vessel.

2. The method of claim 1 further comprising the step of continuously introducing the fluid into the process vessel during the fluid removal step.

3. The method of claim 1 wherein a plurality of different processing fluids are introduced into the process vessel.

4. The method of claim 1 wherein the organic vapor comprises isopropyl alcohol and the fluid comprises water.

5. The method of claim 1 further comprising the step of exposing the workpiece to sonic energy during the immersion step.

6. The method of claim 1 where the workpiece is held in place without movement within the process vessel.

7. The method of claim 1 where the workpiece comprises a semiconductor material wafer.

8. The method of claim 1 further comprising the step of creating a lateral flow on the surface of the fluid in the processing vessel, with the lateral flow originating at the workpiece and moving across the surface of the fluid and through the porous wall of the process vessel.

9. The method of claim 1 further comprising the step of collecting the fluid removed from the process vessel in an outer containment vessel, and removing the fluid collected in the outer containment vessel simultaneously with the removal of fluid from the process vessel.

10. The method of claim 1 further comprising the step of introducing the organic vapor in combination with a carrier gas, above the surface of the fluid in the process vessel.

11. A method for rinsing and drying a batch of workpieces comprising the steps of:

placing the workpieces into a process vessel having a porous sidewall;

introducing a fluid into the process vessel, via inlets adjacent to the bottom of the process vessel, until the level of the fluid in the process vessel is high enough to at least partially immerse the workpieces;

providing an organic vapor above the surface of the fluid in the process vessel;

removing the fluid from the process vessel via flow through the porous sidewall of the process vessel.

12. The method of claim 11 further comprising the step of maintaining the process vessel under positive gas pressure.

13. The method of claim 11 further comprising the step of removing fluid from the process vessel via drains adjacent to an upper end of the vessel.

14. The method of claim 11 wherein the workpieces are held stationary in place.

15. A method for rinsing and drying a semiconductor substrate comprising the steps of:

introducing a processing fluid into a process vessel;

bathing a stationary semiconductor substrate in the processing fluid;

introducing an organic vapor above the processing fluid in the process vessel;

evacuating the processing fluid from the process vessel to expose the semiconductor substrate; and creating a lateral flow on the surface of the processing fluid from the semiconductor substrate to a porous wall of the process vessel.

16. The method of claim 15 further comprising the step of flowing the fluid through the porous wall, collecting the fluid in an outer containment vessel, and removing the collected fluid from the outer containment vessel at a controlled rate, to maintain the level of collected fluid in the outer containment vessel at or below the level of fluid in the process vessel.

17. The method of claim 15 wherein the substrate is dried by surface tension effects created by the organic vapor, with the surface tension effects drawing the fluid off of the substrate.

18. A method for rinsing and drying a workpiece comprising the steps of:

introducing a fluid into a process vessel having a porous wall;

immersing a workpiece at least partially into the fluid;

introducing an organic vapor above the fluid in the process vessel;

removing the fluid from the process vessel via flow through the porous wall of the process vessel;

collecting the fluid removed from the process vessel in an outer containment vessel, wherein the fluid in the process vessel and the outer containment vessel are evacuated at rates which maintain a process vessel meniscus and an outer containment vessel meniscus at substantially equal levels.

19. A method for rinsing and drying a workpiece comprising the steps of:

introducing a fluid into a process vessel having a porous wall;

immersing a workpiece at least partially into the fluid;

introducing an organic vapor above the fluid in the process vessel;

removing the fluid from the process vessel via flow through the porous wall of the process vessel;

collecting the fluid removed from the process vessel in an outer containment vessel, wherein the fluid in the process vessel and the outer containment vessel are evacuated at rates which maintain an outer containment vessel meniscus at a lower level than a process vessel meniscus.

* * * * *